(12) United States Patent
Zhang et al.

(10) Patent No.: US 10,978,467 B2
(45) Date of Patent: Apr. 13, 2021

(54) SONOS NONVOLATILE MEMORY AND METHOD FOR MANUFACTURING SAME

(71) Applicant: Shanghai Huahong Grace Semiconductor Manufacturing Corporation, Shanghai (CN)

(72) Inventors: Kegang Zhang, Shanghai (CN); Hualun Chen, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 8 days.

(21) Appl. No.: 16/444,450

(22) Filed: Jun. 18, 2019

(65) Prior Publication Data

US 2020/0006368 A1  Jan. 2, 2020

(30) Foreign Application Priority Data

Jun. 29, 2018  (CN) .......................... 201810695760.7

(51) Int. Cl.
| | |
|---|---|
| *H01L 27/11568* | (2017.01) |
| *H01L 21/28* | (2006.01) |
| *H01L 29/06* | (2006.01) |

(52) U.S. Cl.
CPC .... *H01L 27/11568* (2013.01); *H01L 29/0649* (2013.01); *H01L 29/40114* (2019.08); *H01L 29/40117* (2019.08)

(58) Field of Classification Search
CPC ......... H01L 27/11568; H01L 29/42344; H01L 29/6659
See application file for complete search history.

(56) References Cited

U.S. PATENT DOCUMENTS 7,064,378 B2 * 6/2006 Jeon ...................... H01L 27/115
                                                                  257/315
7,396,723 B2 * 7/2008 Kim .................. H01L 27/11568
                                                                  257/499

(Continued)

FOREIGN PATENT DOCUMENTS

| CN | 102315174 A | 1/2012 |
|---|---|---|
| CN | 104576522 A | 4/2015 |
| CN | 105742249 A | 7/2016 |

OTHER PUBLICATIONS

Search Report issued in First Office Action from corresponding Chinese Patent Application No. 2018106957607, dated Mar. 12, 2020, pp. 1-2.

*Primary Examiner* — Nicholas J Tobergte
(74) *Attorney, Agent, or Firm* — MKG, LLC

(57) ABSTRACT

A SONOS nonvolatile memory includes a second gate structure of a selectron isolated from a first gate structure of a memotron by an inter-gate dielectric isolation layer formed on a first side of the first gate structure through self-alignment. The second gate structure is formed on a first side of the inter-gate dielectric isolation layer through self-alignment. A cell structure is formed by two adjacent cell structures. A first window defines an area formed by the two first gate structures. Two sides of each first gate structure are defined through self-alignment by first top silicon nitride layers formed on inner sides of the first window. First silicon nitride spacers are formed on second sides of the first gate structures through self-alignment. The bottom area of a contact hole between the second sides of the first gate structures is defined through self-alignment by the two first silicon nitride spacers.

15 Claims, 9 Drawing Sheets

(56) References Cited

U.S. PATENT DOCUMENTS

| | | | |
|---|---|---|---|
| 7,768,061 B2 * | 8/2010 | Jeon | H01L 27/11568 257/324 |
| 2002/0137296 A1 * | 9/2002 | Satoh | H01L 29/66833 438/301 |
| 2006/0160343 A1 | 7/2006 | Chong et al. | |
| 2006/0226474 A1 * | 10/2006 | Ho | H01L 27/1157 257/326 |

* cited by examiner

SONOS NONVOLATILE MEMORY AND METHOD FOR MANUFACTURING SAME

CROSS REFERENCE TO RELATED APPLICATION

The present application claims priority to Chinese Patent Application No. 201810695760.7 filed on Jun. 29, 2018, the entirety of which is incorporated by reference herein.

TECHNICAL FIELD

The invention relates to the field of manufacturing of semiconductor integrated circuits, in particular to a silicon-oxide-nitride-oxide-silicon (SONOS) nonvolatile memory, and a method for manufacturing the SONOS nonvolatile memory.

BACKGROUND OF THE INVENTION

SONOS nonvolatile memories have been widely applied to advanced flash memories and electrically erasable memories. The cell structure of the SONOS nonvolatile memories generally comprises a memotron and a selectron. The cell structure of 2T SONOS nonvolatile memories comprises a complete memotron and a complete selectron, each transistor (namely the memotron or the selectron) has a complete source region, a complete drain region and a complete polysilicon gate, and the polysilicon gates of the two transistors share the same polysilicon layer. Because the memotron and the selectron of the cell structures of existing 2T SONOS nonvolatile memories both comprise complete source regions and complete drain regions, a large area is occupied. In order to reduce the area of the SONOS nonvolatile memories, the 1.5T structure in which only two source-drain regions are configured is usually adopted. FIG. 1 is a view of the cell structure of an existing 1.5T SONOS nonvolatile memory. As shown in FIG. 1, the cell structure of the existing 1.5T SONOS nonvolatile memory is as follows:

A gate structure of a memotron comprises an ONO layer 102, a first polysilicon gate 103 and a top silicon nitride layer 104 which are formed on the surface of a semiconductor substrate such as a silicon substrate 101, wherein the ONO layer 102 is formed by an oxide layer, a nitride layer and another oxide layer which are stacked together.

A gate structure of a selectron comprises a gate oxide layer 105 and a second polysilicon gate 106 formed on the surface of the semiconductor substrate 101.

An inter-gate dielectric isolation layer 107 is located between the first polysilicon gate 103 and the second polysilicon gate 106, and the inter-gate dielectric layer 107 is generally an oxide layer.

Spacers 108 are formed on two sides of an integral structure formed by the first polysilicon gate 103, the inter-gate dielectric isolation layer 107 and the second polysilicon gate 106.

A lightly-doped drain region 109a and a heavily-doped source-drain implantation region 110a are formed on the surface of the semiconductor substrate 101 and correspond to the side face of the first polysilicon gate 103, wherein the lightly-doped drain region 109a is self-aligned with the side face of the first polysilicon gate 103, and the source-drain implantation region 110a is self-aligned with the side face of the corresponding spacer 108.

A lightly-doped drain region 109b and a heavily-doped source-drain implantation region 110b are formed on the surface of the semiconductor substrate 101 and correspond to the side face of the second polysilicon gate 106, wherein the lightly-doped drain region 109b is self-aligned with the side face of the second polysilicon gate 106, and the source-drain implantation region 110b is self-aligned with the side face of the corresponding spacer 108.

In addition, a CMOS logic device, such as an NMOS transistor or a PMOS transistor, is integrated on the surface of the semiconductor substrate 101. FIG. 1 shows a gate structure of a logic device formed by a gate oxide layer 105 and a second polysilicon gate 106 which are stacked together. A lightly-doped drain region 109a and a source-drain implantation region 110a are formed on one of two sides of the gate structure of the logic device, and a lightly-doped drain region 109b and a source-drain implantation region 110b are correspondingly formed on the other side of the gate structure of the logic device.

Self-aligned metal silicides 111 are formed on the surfaces of the second polysilicon gates 106 and the surfaces of the source-drain implantation regions 110a and 110b.

The portions, formed with the gate structures, the source-drain implantation regions and the self-aligned metal silicides 111, of the surface of the semiconductor substrate 101 are covered with an interlayer film 112.

Corresponding contact holes 113 are formed in the tops of the source-drain implantation regions 110a and 110b and the tops of the second polysilicon gates 106, and the contact holes 113 penetrate through the interlayer film 112.

Four cell structures are shown in FIG. 1 and each comprise a first polysilicon gate 103 and a second polysilicon gate 106, which are adjacent to each other and form an integral structure. Generally, the first polysilicon gates 103 of every two adjacent cell structures are adjacent to each other and share one source-drain implantation region 110a, and the second polysilicon gates 106 of every two adjacent cell structures are adjacent to each other and share one source-drain implantation region 110b. As can be seen from FIG. 1, as the contact holes 113 with sizes defined by photoetching need to be formed in the tops of the corresponding source-drain implantation regions 110a, the distance d101 between the first polysilicon gates 103 of every two adjacent cell structures has to be increased to prevent photoetching deviations, which results in a large size of the device.

SUMMARY OF THE INVENTION

The technical issue to be settled by the invention is to provide a SONOS nonvolatile memory to greatly reduce the area of memory cell structures and further provides a manufacturing method of the SONOS nonvolatile memory.

To settle the above technical issue, the invention provides a SONOS nonvolatile memory provided with cell structures each comprising a memotron and a selectron.

A first gate structure of the memotron comprises an ONO layer, a first polysilicon gate and a first top silicon nitride layer which are sequentially stacked on the surface of a semiconductor substrate.

A second gate structure of the selectron comprises a gate dielectric layer and a second polysilicon gate which are sequentially stacked on the surface of the semiconductor substrate.

The second gate structure is isolated from the first gate structure by an inter-gate dielectric isolation layer, wherein the inter-gate dielectric isolation layer is formed on a first side of the first gate structure through self-alignment, and the second gate structure is formed on a first side of the inter-gate dielectric isolation layer through self-alignment.

Two adjacent cell structures form a cell structure combination. In the cell structure combination, second sides of the first gate structures of the two cell structures are adjacent to each other, and the area between the first sides of the first gate structures of the two cell structures is defined by a first window; a second silicon oxide layer is opened through photo-etching to form the first window, and the first top silicon nitride layers of the two cell structures are formed on two inner sides of the first window through self-alignment; second sides of the first polysilicon gates are defined by second sides of the corresponding first top silicon nitride layers through self-alignment, first sides of the first polysilicon gates are defined by first sides of the first top silicon nitride layers through self-alignment, and the portion, outside the first window, of the second silicon oxide layer is removed before the first sides of the first polysilicon gates are defined.

A first silicon nitride spacer is formed on the second side of the first gate structure through self-alignment. The first side of a first polysilicon layer is surrounded by the first silicon nitride spacers and the first top silicon nitride layers. The distance between the two first gate structures in the cell structure combination is defined through self-alignment by the distance between the first silicon nitride spacers.

A first source-drain region is formed in the portion, between the two first silicon nitride spacers in the cell structure combination, of the semiconductor substrate and is shared by the two cell structures in the cell structure combination.

A second source-drain region is formed in the portion, outside a first side of the second gate structure, of the semiconductor substrate and is self-aligned with the first side of the corresponding second gate structure.

The bottom area of a first contact hole in the top of the first source-drain region is defined through self-alignment by second sides of the first silicon nitride spacers in the cell structure combination.

Furthermore, the semiconductor substrate is a silicon substrate.

Furthermore, P-wells are formed on the surface of the semiconductor substrate, and the first gate structure and the second gate structure are formed on the surfaces of the P-wells. The first source-drain region and the second source-drain region are formed by N+ regions.

Furthermore, the gate dielectric layer is an oxide layer, and the inter-gate dielectric gate layer is an oxide layer.

Furthermore, a second spacer is formed on a first side of the second gate structure.

Furthermore, a first lightly-doped drain region is formed in the first source-drain region and has two sides respectively self-aligned with the second sides of the corresponding first polysilicon gates.

A second lightly-doped drain region is formed in the second source-drain region and is self-aligned with the first side of the corresponding second polysilicon gate. The second source-drain region is self-aligned with the first side of the corresponding second spacer.

Furthermore, metal silicides are formed on the surfaces of the first source-drain region, the second source-drain region and the second polysilicon gate through self-alignment.

Furthermore, each memotron further comprises a first polysilicon gate lead-out region. In the first polysilicon gate lead-out region, the first top silicon nitride layer at the top of the first polysilicon gate is removed, and a second contact hole is formed in the area, where the first top silicon nitride layer is removed, of the top of the first polysilicon gate.

To settle the above technical issue, the invention provides a method for manufacturing a SONOS nonvolatile memory. A SONOS nonvolatile memory manufactured through the method is provided with cell structures each comprising a memotron and a selectron. The method comprises the following steps:

Step 1, sequentially forming an ONO layer, a first polysilicon layer and a second silicon oxide layer on the surface of a semiconductor substrate;

Step 2, photo-etching the second silicon oxide layer to form first windows;

Step 3, forming first top silicon nitride layers on two inner sides of each first window through silicon nitride growth and full etching;

Step 4, etching the portion, between every two corresponding first top silicon nitride layers, of the first polysilicon layer for the first time to form second sides of first polysilicon gates of two adjacent memotrons;

Wherein, a first gate structure of the memotron of each cell structure comprises an ONO layer, a first polysilicon layer and a first top silicon nitride layer which are sequentially stacked on the surface of a semiconductor substrate. Every two adjacent cell structures form a cell structure combination, wherein in the cell structure combination, the second sides of the first gate structures of the two cell structures are adjacent to each other, and the second sides of the first polysilicon gates and the second sides of the first top silicon nitride layers are stacked together to form the second sides of the first gate structures.

Step 5, forming first silicon nitride spacers on the second sides of the first gate structures through self-alignment by means of silicon nitride growth and the full etching;

Step 6, carrying out source-drain implantation for the first time to form a first source-drain region in the portion, between the two first silicon nitride spacers in each cell structure combination, of the semiconductor substrate through self-alignment, wherein the first source-drain region is shared by the two cell structures of the corresponding cell structure combination;

Step 7, filling the area between the two first silicon nitride spacers at the top of each first source-drain region with an organic anti-reflection coating;

Step 8, removing the second silicon oxide layer to expose first sides of the first top silicon nitride layers;

Step 9, etching the first polysilicon layer for the second time to form first sides of the first polysilicon gates of the corresponding memotrons, wherein the first sides of the first polysilicon gates and the first sides of the first top silicon nitride layers are self-aligned and stacked together to form first sides of the first gate structures;

Step 10, removing the organic anti-reflection coating, forming an inter-gate dielectric isolation layer on the first sides of the gate structures through self-alignment by means of deposition and full etching, removing the portion, outside the first side of the inter-gate dielectric isolation layer, of the ONO layer, and filling the area between the two first silicon nitride spacers at the top of each said first source-drain region with an inter-gate dielectric isolation layer formed on the second sides of the first gate structures;

Step 11, sequentially forming a gate dielectric layer and a second polysilicon layer, and fully etching the second polysilicon layer to form second polysilicon gates on a first side of the inter-gate dielectric isolation layer through self-alignment, wherein a second gate structure of each said selectron comprises the gate dielectric layer and the second polysilicon gate which are sequentially stacked on the surface of the semiconductor substrate;

Step 12, with the first sides of the second gate structures as self-alignment boundaries, source-drain implantation is carried out for the second time to form second source-drain regions in the portions, outside the first sides of the corresponding second gate structures, of the semiconductor substrate; and Step 13, forming an interlayer film and contact holes, wherein the contact holes penetrate through the interlayer film, and the bottom area of a first contact hole in the top of each first source-drain region is defined through self-alignment by the second sides of the two first silicon nitride spacers in the corresponding cell structure combination.

Furthermore, P-wells are formed on the surface of the semiconductor substrate, the first gate structures and the second gate structures are formed on the surfaces of the P-wells, and the first source-drain regions and the second source-drain regions are formed by N+ regions.

Furthermore, the gate dielectric layers are oxide layers, and the inter-gate dielectric layers are oxide layers.

Furthermore, in Step 11, after the second polysilicon gates are formed, the method further comprises the steps of forming second spacers on the first sides of the second gate structures through deposition and full etching.

Furthermore, before the first silicon nitride spacers are formed in Step 5, the method further comprises the step of carrying out lightly-doped implantation for the first time to form first lightly-doped drain regions, wherein each first lightly-doped drain region has two sides respectively self-aligned with the second sides of the corresponding first polysilicon gates, and the first lightly-doped drain regions are stacked on the first source-drain regions.

Before the second spacers are formed in Step 11, the method further comprises the step of carrying out lightly-doped implantation for the second time to form second lightly-doped drain regions, wherein the second lightly-doped regions are self-aligned with the first sides of the corresponding second polysilicon gates; in Step 12, the second source-drain regions are self-aligned with the first sides of the second spacers, and the second lightly-doped drain region are stacked on the second source-drain regions.

Furthermore, before the interlayer is formed in Step 13, the method further comprises the steps of forming metal silicides on the surfaces of the first source-drain regions, the second source-drain regions and the second polysilicon gates through self-alignment.

Furthermore, each memotron further comprises a first polysilicon gate lead-out region, and after the metal silicides are formed and before the interlayer is formed in Step 13, the method further comprises of step of removing the first top silicon nitride layers at the top of the first polysilicon gates in the first polysilicon gate lead-out regions; and in Step 13 of forming the contact holes, a second contact hole is formed in the area, where the corresponding first top silicon nitride layer is removed, of the top of each said first polysilicon gate.

In each cell structure of the SONOS nonvolatile memory of the invention, the first gate structure of the memotron is defined through self-alignment by the first top silicon nitride layer, which is formed on the inner side of the first window through self-alignment, the inter-gate dielectric isolation layer is formed on the first side of the corresponding first gate structure through self-alignment, and the second gate structure of the selectron is formed on the first side of the inter-gate dielectric isolation layer through self-alignment, so that the gate structures of the memotron and the selectron are formed through self-alignment without being additionally defined through photoetching, and thus, the size of the cell structures is minimized.

In addition, the distance between the first gate structures of every two adjacent cell structures is defined by the distance between the two first top silicon nitride layers serving as inner spacers of the corresponding first window, after the first silicon nitride spacers are formed on the second sides of the two first top silicon nitride layers, the distance between the two adjacent first gate structures in the cell structure combination is defined through self-alignment by the distance between the first silicon nitride spacers, and the bottom area of the first contact hole in the top of the first source-drain region between the two adjacent first gate structures is defined through self-alignment by the second sides of the two first silicon nitride spacers in the cell structure combination, so that the distance between the cell structures (namely the size of the corresponding cell structure combination) is minimized in this embodiment.

From the above description, the area of the memory cell structures is effectively reduced; and meanwhile, photoetching is adopted only once for defining the first windows of the cell structures of the memory; after the first windows are formed, the first gate structure of each memotron, the second gate structure of each selectron and sizes of the first gate structures and the second gate structures are all defined through self-alignment without photoetchng, and thus, this embodiment also has the advantage of low process cost.

BRIEF DESCRIPTION OF THE DRAWINGS

The invention is further expounded below with reference to the accompanying drawings and specific embodiments.

DETAILED DESCRIPTION OF THE INVENTION

Figure 1:
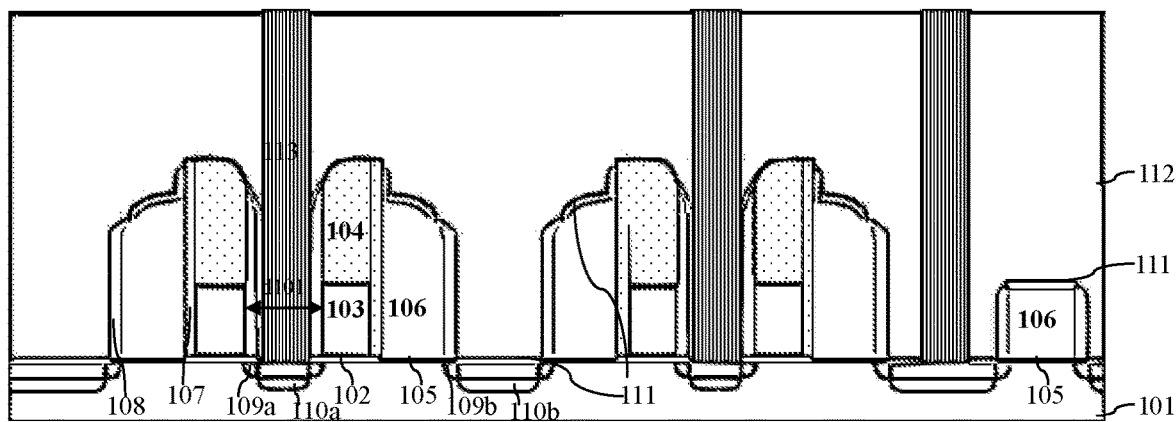
FIG. 1 is a view of cell structures of an existing 1.5T SONOS nonvolatile memory.
Figure 2:
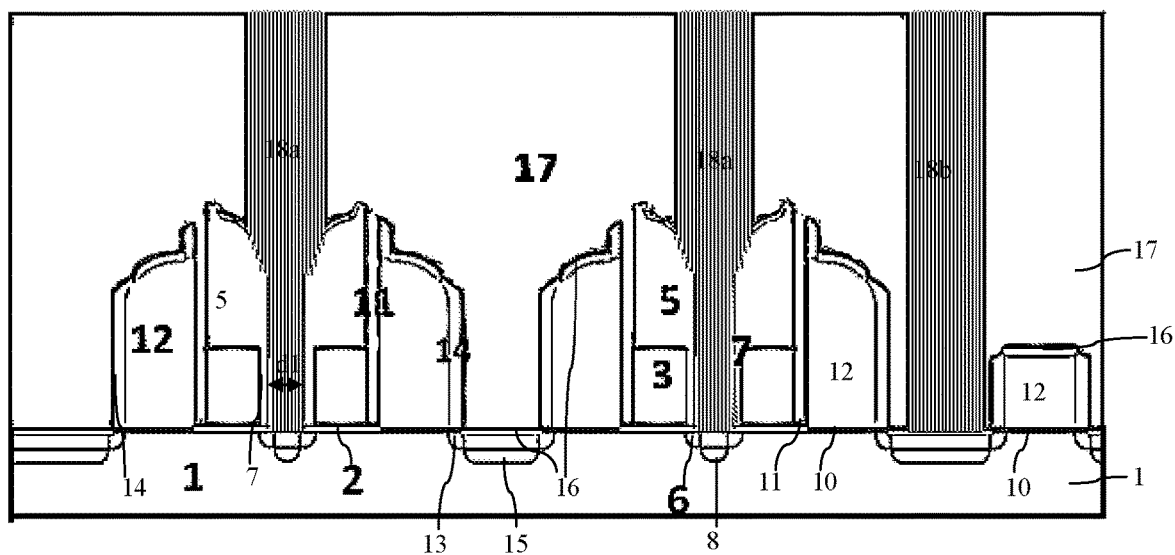
FIG. 2 is a view of cell structures of a SONOS nonvolatile memory in one embodiment of the invention.

FIG. 2 is a view of cell structures of a SONOS nonvolatile memory in one embodiment of the invention. As shown in FIG. 2, each cell structure of the SONOS nonvolatile memory comprises a memotron and a selectron.

A first gate structure of the memotron comprises an ONO layer 2, a first polysilicon gate 3 and a first top silicon nitride layer 5 which are sequentially stacked on the surface of a semiconductor substrate 1.

In this embodiment, the semiconductor substrate 1 is a silicon substrate. P-wells are formed on the surface of the semiconductor substrate 1. The first gate structure and the second gate structure are formed on the surfaces of the P-wells.

The second gate structure of the selectron comprises a gate dielectric layer 10 and a second polysilicon gate 12 which are sequentially stacked on the surface of the semiconductor substrate 1.

The second gate structure is isolated from the first gate structure by an inter-gate dielectric isolation layer 11. The inter-gate dielectric isolation layer 11 is formed on a first side of the first gate structure through self-alignment. The second gate structure is formed on a first side of the inter-gate dielectric isolation layer 11 through self-alignment.

Two adjacent cell structures form a cell structure combination. In this cell structure combination, second sides of the first gate structures of the two cell structures are adjacent to each other, and an area between the first sides of the first gate structures of the two cell structures is defined by a first window; a second silicon oxide layer 4 is opened through photo-etching to form the first window (refer to FIG. 3A and FIG. 3B of the method mentioned below for the second silicon oxide layer 4), and the first top silicon nitride layers 5 of the two cell structures are formed on two inner sides of the first window through self-alignment; a second side of the first polysilicon gate 3 is defined through self-alignment by a second side of the corresponding first top silicon nitride layer 5. A first side of the first polysilicon gate 3 is defined through self-alignment by a first side of the corresponding first top silicon nitride layer 5. The portion, outside the first window, of the second silicon oxide 4 is removed before the first side of the first polysilicon gate 3 is defined.

A first silicon nitride spacer 7 is formed on a second side of the first gate structure through self-alignment. A first side of a first polysilicon layer is surrounded by the first silicon nitride spacers 7 and the first top silicon nitride layers 5. In the cell structure combination, the distance between the two first gate structures is defined through self-alignment by the distance between the first silicon nitride spacers 7.

A first source-drain region 8 is formed in the portion, between the two first silicon nitride spacers 7 in the cell structure combination, of the semiconductor substrate 1 through self-alignment and is shared by the two cell structures in the cell structure combination.

A second source-drain region 15 is formed in the portion, outside the first side of the second gate structure, of the semiconductor substrate 1 and is self-aligned with the first side of the corresponding second gate structure.

The bottom area of a first contact hole 18a in the top of the first source-drain region 8 is defined through self-alignment by the second sides of the two first silicon nitride spacers 7 in the cell structure combination.

In this embodiment, the first source-drain region 8 and the second source-drain region 15 are formed by N+ regions.

The gate dielectric layer 10 is an oxide layer, and the inter-gate dielectric layer 11 is an oxide layer.

A second spacer 14 is formed on the first side of the second gate structure.

A first lightly-doped drain region 6 is formed in the first source-drain region 8 and has two sides respectively self-aligned with the second sides of the corresponding first polysilicon gates 3.

A second lightly-doped drain region 13 is formed in the second source-drain region 15 and is self-aligned with the first sides of the corresponding second polysilicon gates 12. The second source-drain region 15 is self-aligned with the first sides of the corresponding second spacers 14.

Metal silicides 16 are formed on the surfaces of the first source-drain region 8, the second source-drain region 15 and the second polysilicon gate 12 through self-alignment.

The memotron further comprises a first polysilicon gate 3 lead-out region. In the first polysilicon gate 3 lead-out region, the first top silicon nitride layer 5 at the top of the first polysilicon gate 3 is removed, and in the area where the first top silicon nitride layer 5 is removed, a second contact hole 18c is formed in the top of the first polysilicon gate 3. Please refer to FIG. 3X for the structure of the second contact hole 18c.

A corresponding third contact hole 18b is formed in the top of the second source-drain region 15. The first contact hole 18a, the second contact hole 18c and the third contact hole 18b penetrate through an interlayer film 17 and are formed at the same time.

In this embodiment, a CMOS logic device, such as a NMOS transistor or a PMOS transistor, is integrated on the surface of the semiconductor substrate 1. FIG. 2 shows the gate structure, formed by the gate oxide layer 10 and the second polysilicon gate 12 which are stacked together, of a logic device. A lightly-doped drain region 13 and a source-drain implantation region 15 are correspondingly and symmetrically formed on two sides of the gate structure of the logic device.

In each cell structure of the SONOS nonvolatile memory in this embodiment, the first gate structure of the memotron is defined through self-alignment by the first top silicon nitride layer 5, which is formed on the inner side of the first window through self-alignment, the inter-gate dielectric isolation layer 11 is formed on the first side of the corresponding first gate structure through self-alignment, and the second gate structure of the selectron is formed on the first side of the inter-gate dielectric isolation layer 11 through self-alignment, so that the gate structures of the memotron and the selectron are formed through self-alignment without being additionally defined through photoetching, and thus, the size of the cell structures is minimized.

In addition, in this embodiment, the distance between the first gate structures of every two adjacent cell structures is defined by the distance between the two first top silicon nitride layers 5 serving as inner spacers of the corresponding first window, after the first silicon nitride spacers 7 are formed on the second sides of the two first top silicon nitride layers 5, the distance between the two adjacent first gate structures in the cell structure combination is defined through self-alignment by the distance between the first silicon nitride spacers 7, and the bottom area of the first contact hole 18a in the top of the first source-drain region 8 between the two adjacent first gate structures is defined through self-alignment by the second sides of the two first silicon nitride spacers 7 in the cell structure combination, so that the distance between the cell structures (namely the size of the corresponding cell structure combination) is minimized in this embodiment.

From the above description, the area of the memory cell structures is effectively reduced; and meanwhile, photoetching is adopted only once for defining the first windows of the cell structures of the memory; after the first windows are formed, the first gate structure of each memotron, the second gate structure of each selectron and sizes of the first gate structures and the second gate structures are all defined through self-alignment without photoetchng, and thus, this embodiment also has the advantage of low process cost.

Figure 3A:
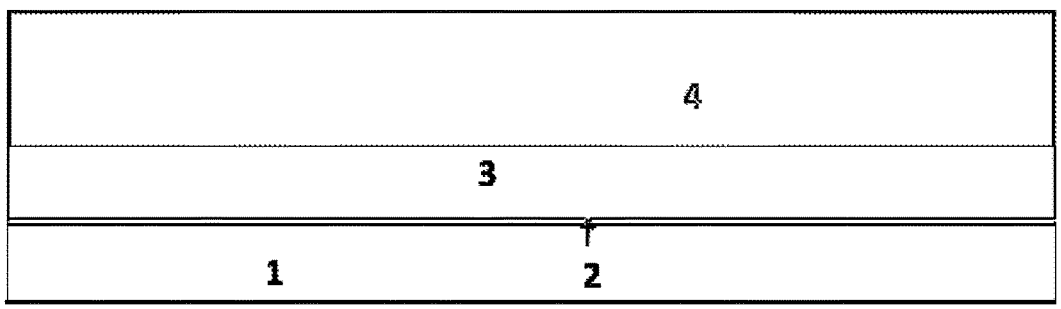
FIGS. 3A-3X are views of device structures in all steps of a method in one embodiment of the invention.
Figure 3B:
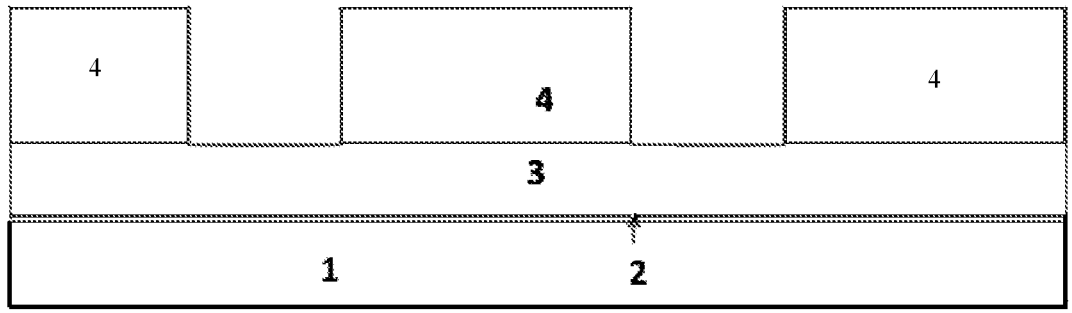
Figure 3C:
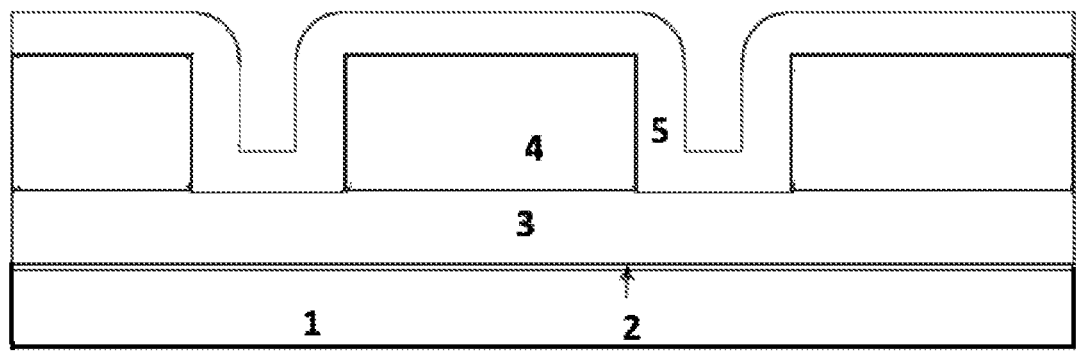
Figure 3D:
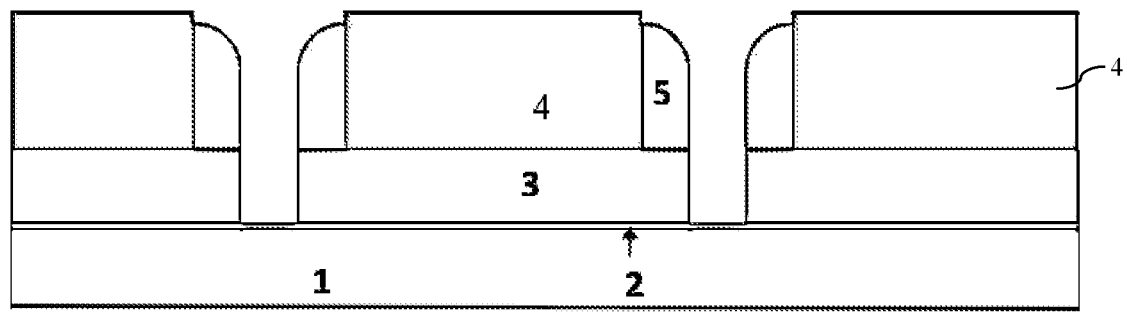
Figure 3E:
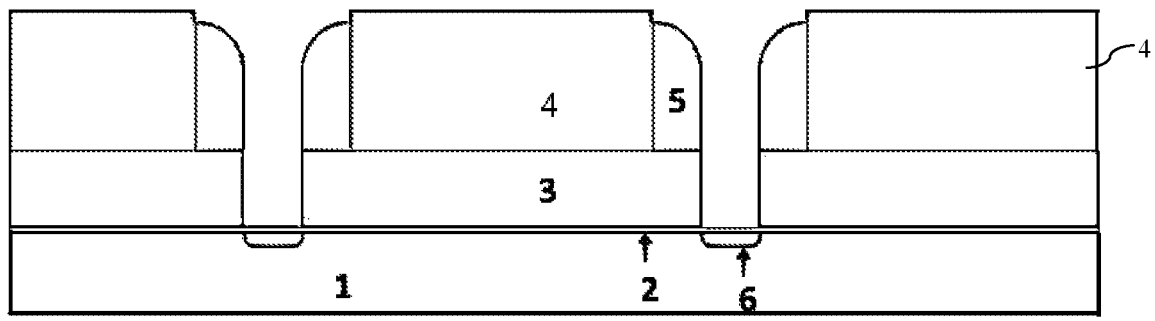
Figure 3F:
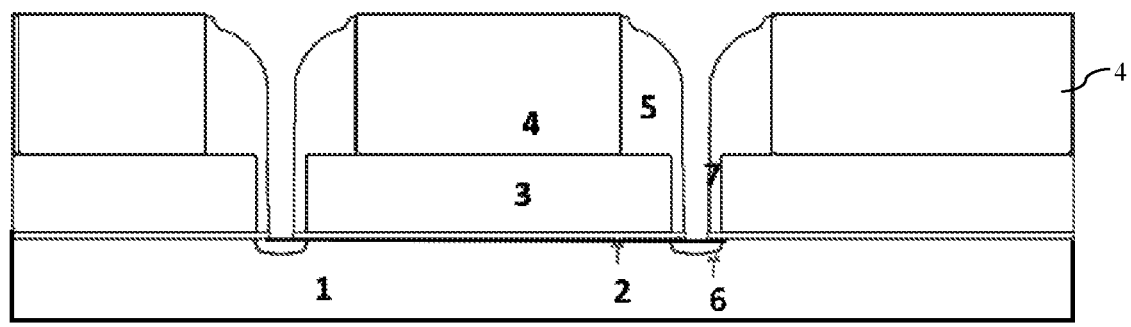
Figure 3G:
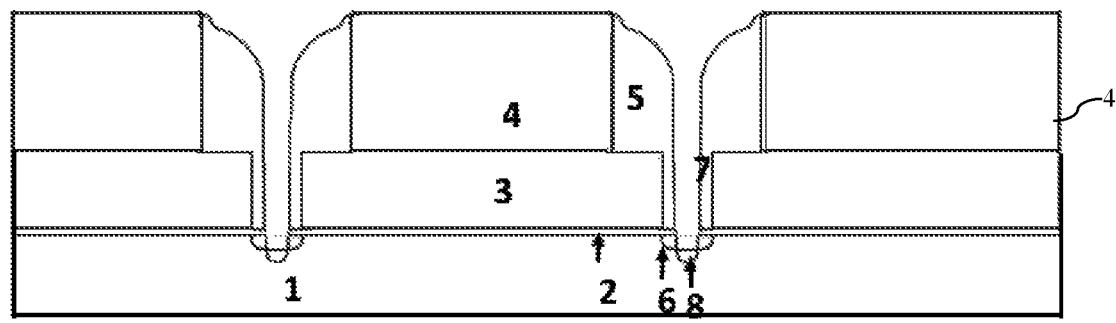
Figure 3H:
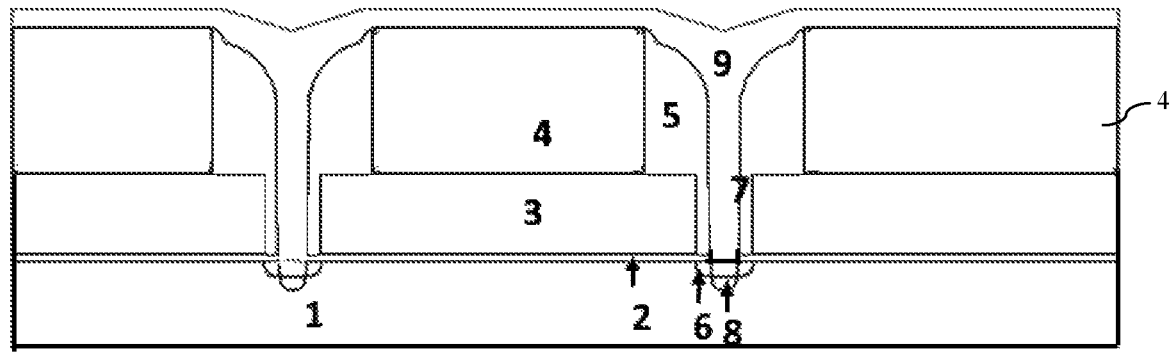
Figure 3I:
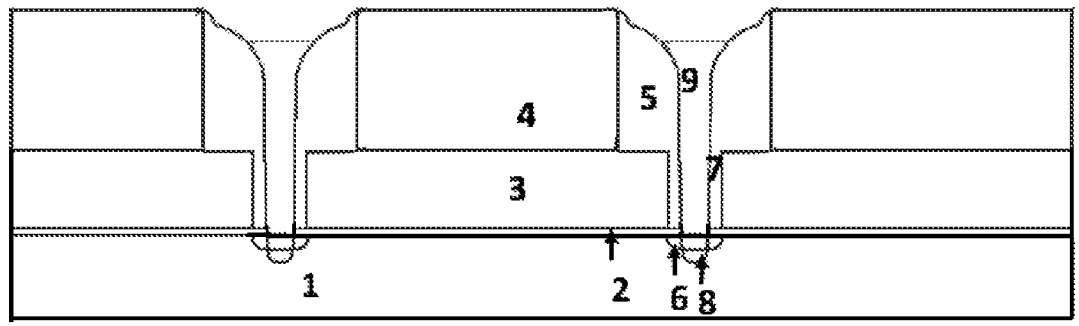
Figure 3J:
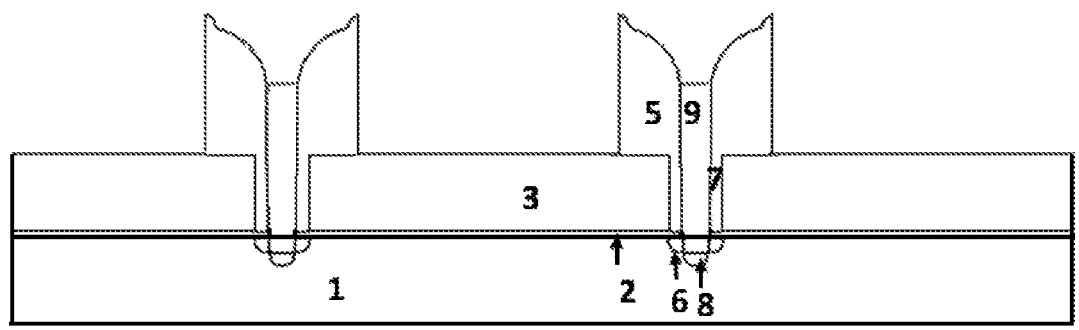
Figure 3K:
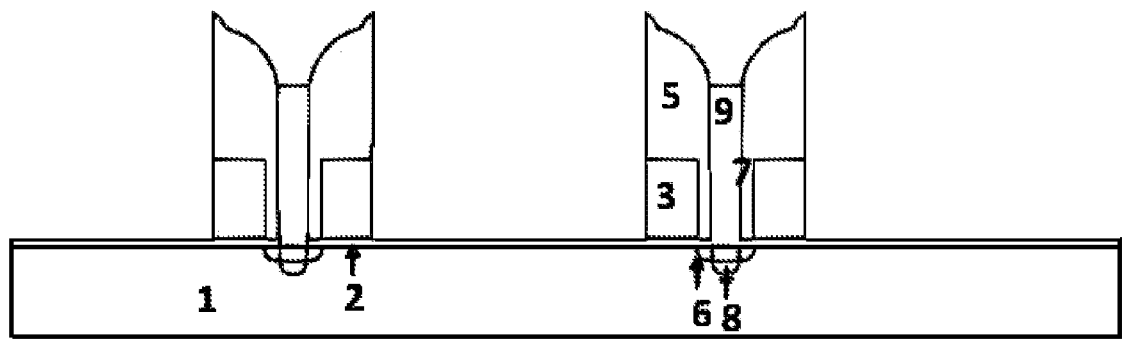
Figure 3L:
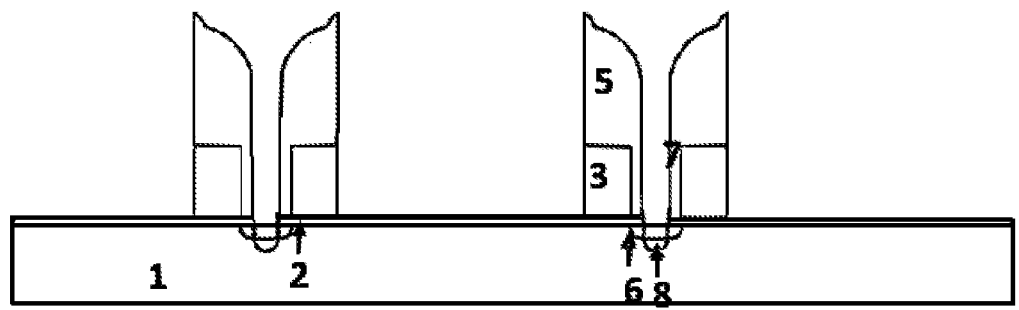
Figure 3M:
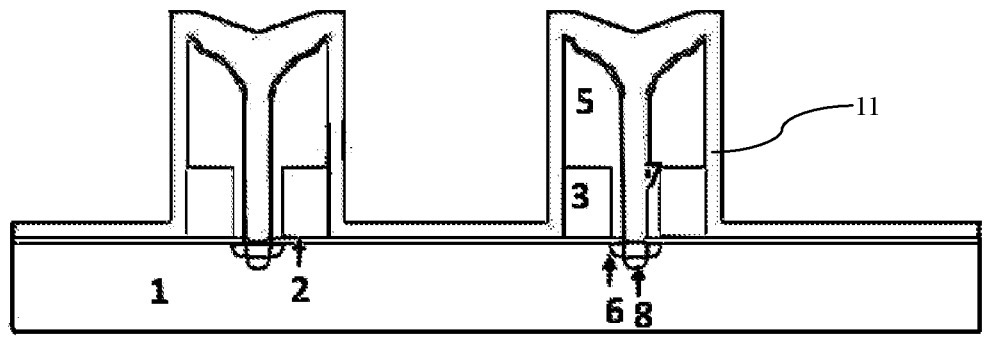
Figure 3N:
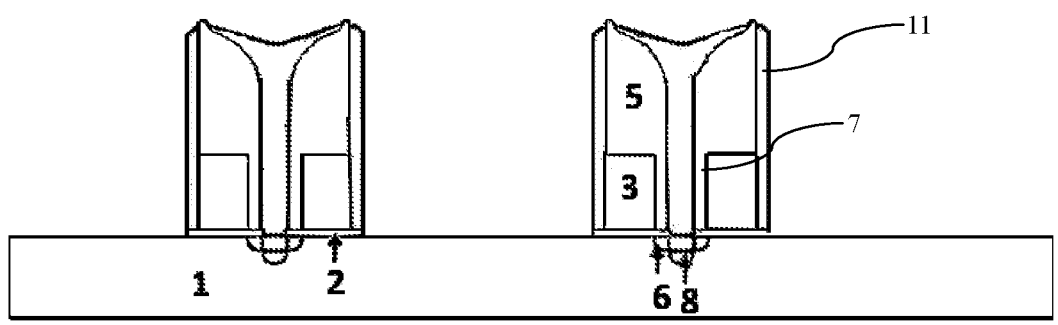
Figure 3O:
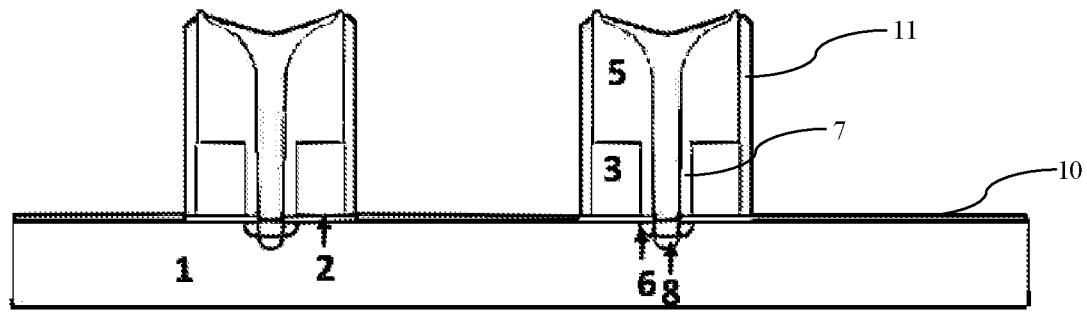
Figure 3P:
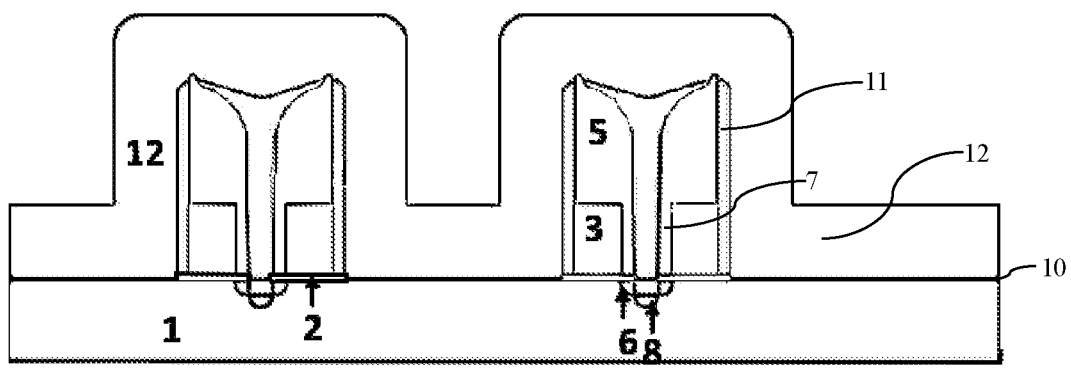
Figure 3Q:
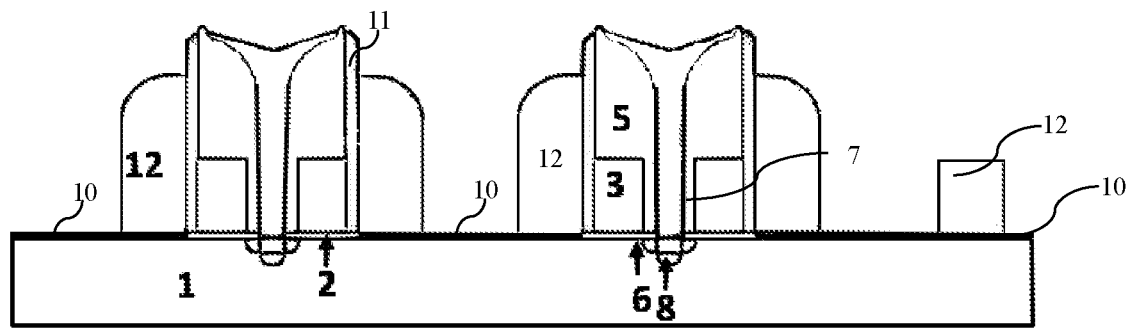
Figure 3R:
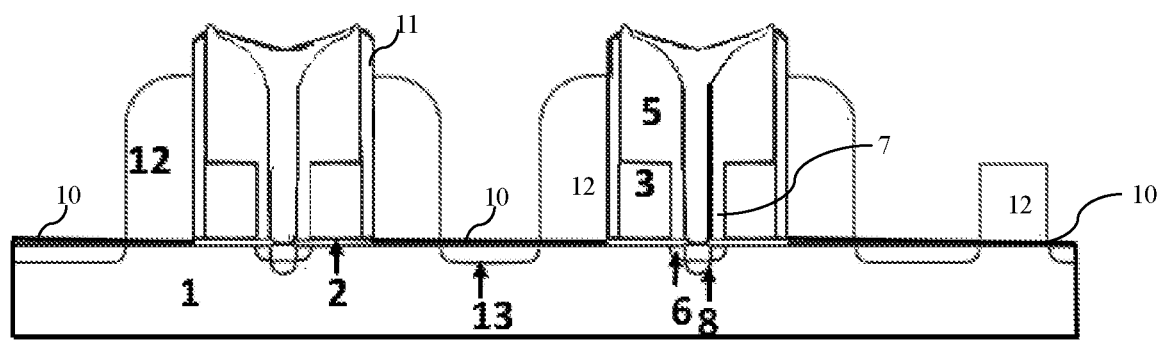
Figure 3S:
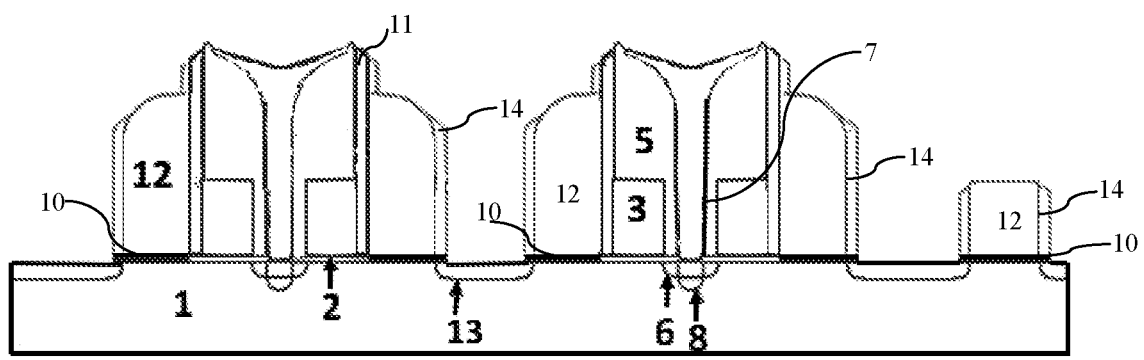
Figure 3T:
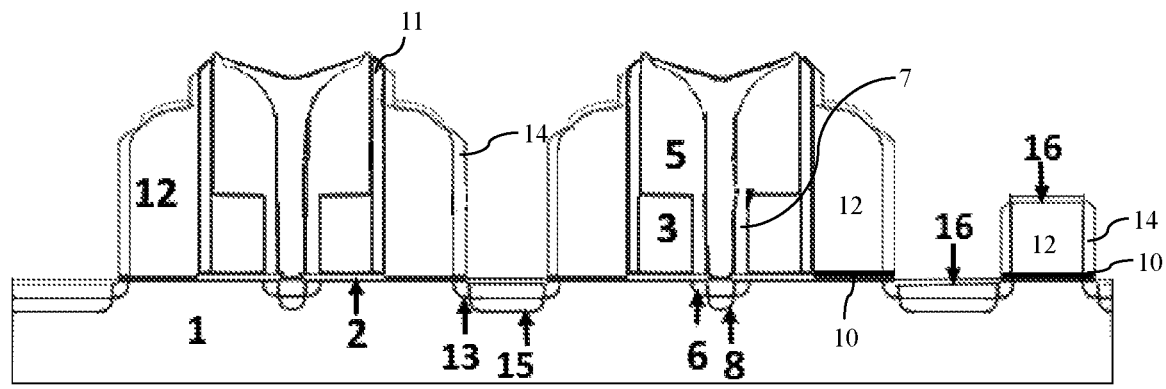
Figure 3U:
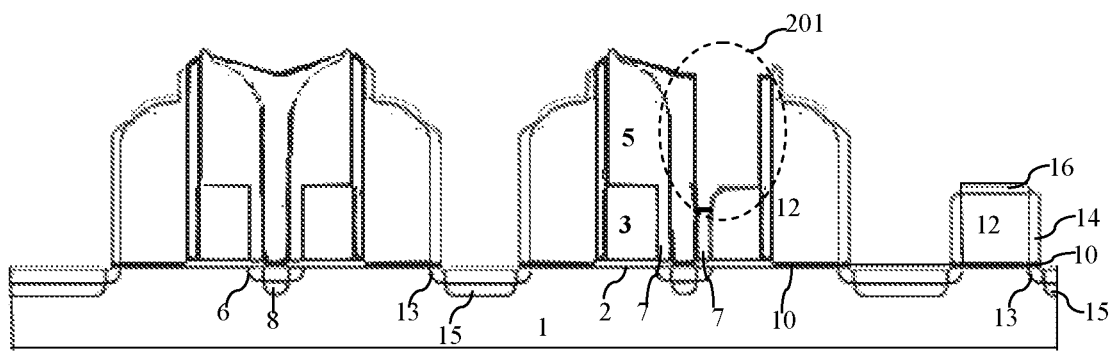
Figure 3V:
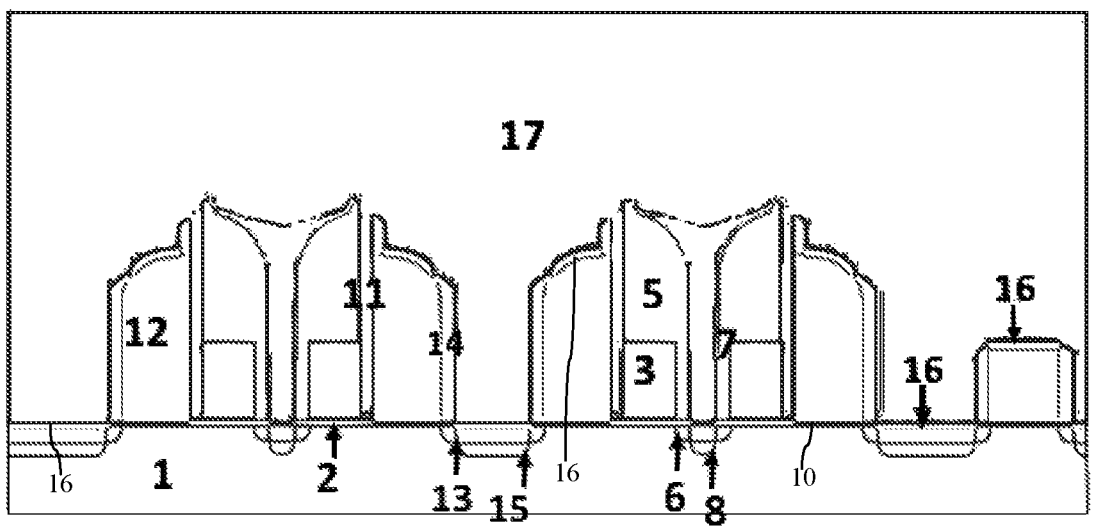
Figure 3W:
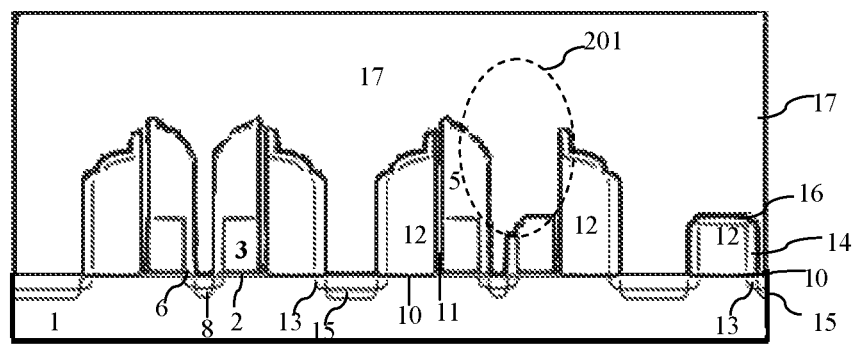
Figure 3X:
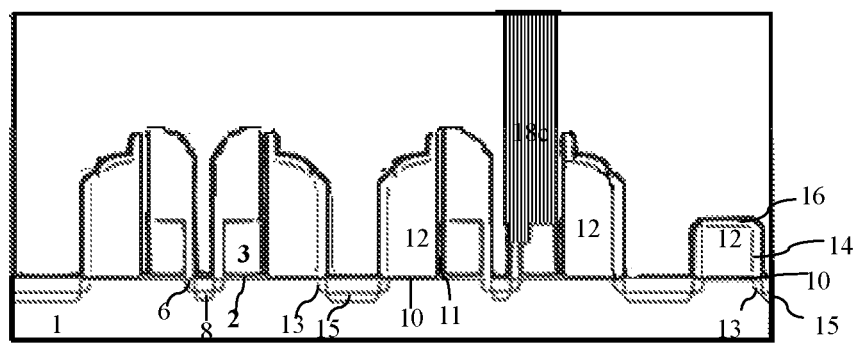

FIGS. 3A-3X are views of device structures in all steps of a method in one embodiment of the invention. As shown in FIGS. 3A-3X, a SONOS nonvolatile memory manufactured through the method for manufacturing a SONOS nonvolatile memory in this embodiment is provided with cell structures each comprising a memotron and a selectron. The method comprises the following steps:

Step 1, as shown in FIG. 3A, an ONO layer 2, a first polysilicon layer 3 and a second silicon oxide layer 4 are sequentially formed on the surface of a semiconductor substrate 1.

P-wells are formed on the surface of the semiconductor substrate 1, and first gate structures and second gate structures are formed on the surfaces of the P-wells.

Step 2, as shown in FIG. 3B, the second silicon oxide layer 4 is photo-etched to form first windows.

Step 3, first top silicon nitride layers 5 are formed on two inner sides of each said first window through silicon nitride growth and full etching. As shown in FIG. 3C which corresponds to silicon nitride growth, a first top silicon nitride layer 5 covering the inner surfaces and outer surfaces of the first windows is formed after silicon nitride growth is completed. FIG. 3D shows the structure obtained after full etching, and as shown in FIG. 3D, two first top silicon nitride layers 5 are located on the two inner sides of each first window.

Step 4, as shown in FIG. 3D, the portion, between every two corresponding first top silicon nitride layers 5, of the first polysilicon layer 3 is etched for the first time to form second sides of first polysilicon gates 3 of the two corresponding adjacent memotrons.

A first gate structure of the memotron of each said cell structure comprises the ONO layer 2, the first polysilicon gate 3 and the first top silicon nitride layer 5 which are sequentially stacked on the surface of the semiconductor substrate 1. Every two adjacent cell structures form a cell structure combination in which the second sides of the first gate structures of the two cell structures are adjacent to each other and the second sides of the first polysilicon gates 3 and the second sides of the first top silicon nitride layers 5 are stacked to form the second sides of the first gate structures.

As shown in FIG. 3E, lightly-doped drain implantation is carried out for the first time to form first lightly-doped drain regions 6, and two sides of each lightly-doped drain region 6 are respectively self-aligned with the second sides of the corresponding first polysilicon gates 3.

Step 5, as shown in FIG. 3F, first silicon nitride spacers 7 are formed on the second sides of the first gate structures through silicon nitride and full etching.

Step 6, as shown in FIG. 3G, source-drain implantation is carried out for the first time to form a first source-drain region 8 through self-alignment in the portion, between the two first silicon nitride spacers 7 in each cell structure combination, of the semiconductor substrate 1, wherein the first source-drain region 8 is shared by the two cell structures in the cell structure combination. The first lightly-doped drain regions 6 are stacked on the first source-drains 8. The first source-drain regions 8 are formed by N+ regions.

Step 7, the area between the two first silicon nitride spacers 7 at the top of each first source-drain region 8 is filled with an organic anti-reflection coating 9. First, as shown in FIG. 3H, the organic anti-reflection coating 9 is formed, wherein the organic anti-reflection coating 9 fills the area between every two corresponding first silicon nitride spacers 7 and then extends to the outer surface outside the area between the two corresponding first silicon nitride spacers 7; afterwards, as shown in FIG. 3I, the organic anti-reflection coating 9 is etched back to remove the portion, outside the area between every two corresponding first silicon nitride spacers 7, of the organic anti-reflection coating 9, so that the organic anti-reflection coating 9 is located only in the area between the two first silicon nitride spacers 7 at the top of each first source-drain region 8.

Step 8, as shown in FIG. 3J, the second silicon oxide layer 4 is removed to expose first sides of the first top silicon nitride layers 5.

Step 9, as shown in FIG. 3K, the first polysilicon layer 3 is etched for the second time to form first sides of the first polysilicon gates 3 of the corresponding memotrons, and the first sides of the first polysilicon gates 3 and the first sides of the first top silicon nitride layers 5 are self-aligned and stacked together to form first sides of the first gate structures.

Step 10, as shown in FIG. 3L, the organic anti-reflection layer 9 is removed.

An inter-gate dielectric isolation layer 11 is formed on the first sides of the first gate structures through self-alignment by means of deposition and full etching, the portion, outside the first side of the inter-gate dielectric isolation layer 11, of the ONO layer 2 are removed, and an inter-gate dielectric isolation layer 11 formed on the second sides of the first gate structures at the same time fills the area between the two first silicon nitride spacers 7 at the top of each said first source-drain region 8. The structure obtained after deposition of the inter-gate dielectric isolation layers 11 is shown in FIG. 3M, and the structure obtained after full etching of the inter-gate dielectric isolation layers 11 is shown in FIG. 3N.

The inter-gate dielectric isolation layers 11 are oxide layers.

Step 11, a gate dielectric layer 10 is formed, as shown in FIG. 3O, wherein the gate dielectric layer 10 is an oxide layer.

As shown in FIG. 3P, a second polysilicon layer 12 is formed. As shown in FIG. 3Q, the second polysilicon layer is fully etched to form second polysilicon gates 12 on the first sides of the inter-gate dielectric isolation layers 11 through self-alignment. A second gate structure of each said selectron comprises the gate dielectric layer 10 and the second polysilicon gate 12 which are sequentially stacked on the surface of the semiconductor substrate 1. As for the method in this embodiment, a CMOS logic device, such as an NMOS transistor or a PMOS transistor, is integrated on the surface of the semiconductor substrate 1. As shown in FIG. 3Q, the gate structure, formed by the gate dielectric layer 10 and the second polysilicon layer 12 which are stacked together, of the logic device is also formed in Step 11.

Afterwards, as shown in FIG. 3R, lightly-doped drain implantation is carried out for the second time to form second lightly-doped drain regions 13, wherein the second lightly-doped drain regions 13 are also formed on two sides of the gate structure of the logic device, and the second lightly-doped drain regions 13 are self-aligned with the first sides of the corresponding second polysilicon gates 12.

As shown in FIG. 3S, second spacers 14 are formed on the first sides of the second gate structures through deposition and full etching.

Step 12, as shown in FIG. 3T, with the second spacers 14 on the first sides of the second gate structures as self-alignment boundaries, source-drain implantation is carried out for the second time to form second source-drain regions 15 in the portions, outside the first sides of the corresponding second gate structures, of the semiconductor substrate 1, wherein the second source-drain regions 15 are formed by an N+ regions and are stacked on the second lightly-doped drain regions 13.

Step 13, as shown in FIG. 3T, metal silicides 16 are formed on the surfaces of the first source-drain regions 8, the second source-drain regions 15 and the second polysilicon gates 12 through self-alignment.

As shown in FIG. 3V, an interlayer film 17 is formed. As shown in FIG. 2, contact holes are formed, wherein the contact holes penetrate through the interlayer film 17, the bottom area of a first contact hole 18a in the top of each said first source-drain region 8 is defined through self-alignment by the second sides of the two first silicon nitride spacers 7 in the corresponding cell structure combination.

In this embodiment, the contact holes include the first contact holes 18a located in the top of the first source-drain regions 8, third contact holes 18b located in the top of the second source-drain regions 15 and second contact holes 18c located in the top of the corresponding first polysilicon gates 3, and corresponding fourth contact holes (not shown) need to be formed in the top of the second polysilicon gates 12. Usually, the contact holes are not definitely located on the same section and thus need to be shown by independent sectional views. The second contact holes 18c are formed in first polysilicon gate 3 lead-out regions. Please refer to FIG. 3X for the structure of the second contact holes 18c.

As the first top silicon nitride layers 5 are formed at the top of the first polysilicon gates 3, in order to form the corresponding second contact holes 18c, the method further comprises the step: in the first polysilicon gate 3 lead-out regions, the first top silicon nitride layers 5 at the top of the first polysilicon gates 3 are removed, as shown in FIG. 3U.

As shown in FIG. 3W, after the interlayer film 17 is formed, the areas where the first top silicon nitride layers at the top of the first polysilicon gates 3 are removed are filled by the interlayer film 17, in the first polysilicon gate 3 lead-out regions.

As shown in FIG. 3X, the contact holes are formed through the step of etching openings of the contact holes and the step of filling the openings with metals. As the interlayer film 17 is located at the top of the first polysilicon gates 3 in the first polysilicon gate 3 lead-out regions, the top of the first polysilicon gates 3 is opened by etching the openings of the contact holes; and after the openings are filled with metals, the second contact holes 18c make contact with the top of the polysilicon gates 3.

The invention is expounded above with reference to the specific embodiments, but these embodiments are not intended to limit the invention. Various transformations and improvements made by those skilled in this field without deviating from the principle of the invention should also fall within the protection scope of the invention.

What is claimed is:

1. A SONOS nonvolatile memory, wherein cell structures of the SONOS nonvolatile memory each comprises a memotron and a selectron, wherein:
   a first gate structure of the memotron comprises an ONO layer, a first polysilicon gate and a first top silicon nitride layer which are sequentially stacked on a surface of a semiconductor substrate;
   a second gate structure of the selectron comprises a gate dielectric layer and a second polysilicon gate which are sequentially stacked on the surface of the semiconductor substrate;
   the second gate structure is isolated from the first gate structure by an inter-gate dielectric isolation layer which is formed on a first side of the first gate structure through self-alignment, and the second gate structure is formed on a first side of the inter-gate dielectric isolation layer through self-alignment;
   two adjacent said cell structures form a cell structure combination; in the cell structure combination, second sides of the first gate structures of the two cell structures are adjacent to each other, and an area between the first sides of the first gate structures of the two cell structures is defined by a first window; a second silicon oxide layer is opened through photo-etching to form the first window, and the first top silicon nitride layers of the two cell structures are formed on two inner sides of the first window through self-alignment; second sides of the first polysilicon gates are defined through self-alignment by second sides of the corresponding first top silicon nitride layers, first sides of the first polysilicon gates are defined through self-alignment by first sides of the first top silicon nitride layers, and a portion, outside the first window, of the second silicon oxide layer is removed before the first sides of the first polysilicon gates are defined;
   a first silicon nitride spacer is formed on the second side of the first gate structure through self-alignment, and a second side of a first polysilicon layer is surrounded by the first silicon nitride spacers and the first top silicon nitride layers; the distance between the two first gate structures in the cell structure combination is defined through self-alignment by the distance between the first silicon nitride spacers;
   a first source-drain region is formed in a portion, between the two first silicon nitride spacers in the cell structure combination, of the semiconductor substrate and is shared by the two cell structures in the cell structure combination;
   a second source-drain region is formed in a portion, outside a first side of the second gate structure, of the semiconductor substrate and is self-aligned with the first side of the corresponding second gate structure; and
   a bottom area of a first contact hole in a top of the first source-drain region is defined through self-alignment by second sides of the first silicon nitride spacers in the cell structure combination.

2. The SONOS nonvolatile memory according to claim 1, wherein the semiconductor substrate is a silicon substrate.

3. The SONOS nonvolatile memory according to claim 2, wherein P-wells are formed on the surface of the semiconductor substrate, the first gate structures and the second gate structures are formed on surfaces of the P-wells, and the first source-drain regions and the second source-drain regions are formed by N+ regions.

4. The SONOS nonvolatile memory according to claim 2, wherein the gate dielectric layers are oxide layers, and the inter-gate dielectric gate layers are oxide layers.

5. The SONOS nonvolatile memory according to claim 2, wherein a second spacer is formed on a first side of each said second gate structure.

6. The SONOS nonvolatile memory according to claim 5, wherein a first lightly-doped drain region is formed in each said first source-drain region and has two sides respectively self-aligned with second sides of the corresponding first polysilicon gates;
   a second lightly-doped drain region is formed in each said second source-drain region and is self-aligned with a first side of the corresponding second polysilicon gate, and each said second source-drain region is self-aligned with a first side of the corresponding second spacer.

7. The SONOS nonvolatile memory according to claim 6, wherein metal silicides are formed on surfaces of the first source-drain regions, the second source-drain regions and the second polysilicon gates through self-alignment.

8. The SONOS nonvolatile memory according to claim 1, wherein each said memotron further comprises a first polysilicon gate lead-out region; and in the first polysilicon gate lead-out region, the first top silicon nitride layer at the top of the first polysilicon gate is removed, and a second contact hole is formed in an area, where the first top silicon nitride layer is removed, of the top of the first polysilicon gate.

9. A method for manufacturing a SONOS nonvolatile memory, wherein cell structures of a SONOS nonvolatile memory each comprises a memotron and a selectron, and the method comprises the following steps:

Step 1, sequentially forming an ONO layer, a first polysilicon layer and a second silicon oxide layer on a surface of a semiconductor substrate;

Step 2, photo-etching the second silicon oxide layer to form first windows;

Step 3, forming first top silicon nitride layers on two inner sides of each said first window through silicon nitride growth and full etching;

Step 4, etching a portion, between every two said corresponding first top silicon nitride layers, of the first polysilicon layer for the first time to form second sides of first polysilicon gates of two said adjacent memotrons;

wherein, a first gate structure of the memotron of each said cell structure comprises one said ONO layer, one said first polysilicon layer and one said first top silicon nitride layer which are sequentially stacked on the surface of the semiconductor substrate; two said adjacent cell structures form a cell structure combination, wherein in the cell structure combination, second sides of the first gate structures of the two cell structures are adjacent to each other, and the second sides of the first polysilicon gates and second sides of the first top silicon nitride layers are stacked together to form second sides of the first gate structures;

Step 5, forming first silicon nitride spacers on the second sides of the first gate structures through self-alignment by means of silicon nitride growth and full etching;

Step 6, carrying out source-drain implantation for the first time to form a first source-drain region in a portion, between the two first silicon nitride spacers in the cell structure combination, of the semiconductor substrate through self-alignment, wherein the first source-drain region is shared by the two cell structures of the corresponding cell structure combination;

Step 7, filling an area between the two first silicon nitride spacers at the top of each said first source-drain region with an organic anti-reflection coating;

Step 8, removing the second silicon oxide layer to expose first sides of the first top silicon nitride layers;

Step 9, etching the first polysilicon layer for the second time to form first sides of the first polysilicon gates of the corresponding memotrons, wherein the first sides of the first polysilicon gates and the first sides of the first top silicon nitride layers are self-aligned and stacked together to form first sides of the first gate structures;

Step 10, removing the organic anti-reflection coating, forming an inter-gate dielectric isolation layer on the first sides of the gate structures through self-alignment by means of deposition and full etching, removing a portion, outside the first side of the inter-gate dielectric isolation layer, of the ONO layer, and filling an area between the two first silicon nitride spacers at the top of each said first source-drain region with an inter-gate dielectric isolation layer formed on the second sides of the first gate structures;

Step 11, sequentially forming a gate dielectric layer and a second polysilicon layer, and fully etching the second polysilicon layer to form second polysilicon gates on a first side of the inter-gate dielectric isolation layer through self-alignment, wherein a second gate structure of each said selectron comprises one said gate dielectric layer and one said second polysilicon gate which are sequentially stacked on the surface of the semiconductor substrate;

Step 12, with first sides of the second gate structure as self-alignment boundaries, source-drain implantation is carried out for the second time to form second source-drain regions in portions, outside the first sides of the corresponding second gate structures, of the semiconductor substrate; and Step 13, forming an interlayer film and contact holes, wherein the contact holes penetrate through the interlayer film, and a bottom area of a first contact hole in a top of each said first source-drain region is defined through self-alignment by second sides of the two first silicon nitride spacers in the corresponding cell structure combination.

10. The method for manufacturing the SONOS nonvolatile memory according to claim 9, wherein P-wells are formed on the surface of the semiconductor substrate, the first gate structures and the second gate structures are formed on surfaces of the P-wells, and the first source-drain regions and the second source-drain regions are formed by N+ regions.

11. The method for manufacturing the SONOS nonvolatile memory according to claim 9, wherein the gate dielectric layers are oxide layers, and the inter-gate dielectric layers are oxide layers.

12. The method for manufacturing the SONOS nonvolatile memory according to claim 9, wherein in Step 11, after the second polysilicon gates are formed, the method further comprises the steps of forming second spacers on the first sides of the second gate structures through deposition and full etching.

13. The method for manufacturing the SONOS nonvolatile memory according to claim 12, wherein:

before the first silicon nitride spacers are formed in Step 5, the method further comprises the step of carrying out lightly-doped implantation for the first time to form first lightly-doped drain regions, wherein each said first lightly-doped drain region has two sides respectively self-aligned with the second sides of the corresponding first polysilicon gates, and the first lightly-doped drain regions are stacked on the first source-drain regions;

before the second spacers are formed in Step 11, the method further comprises the step of carrying out lightly-doped implantation for the second time to form second lightly-doped drain regions, wherein the second lightly-doped regions are self-aligned with the first sides of the corresponding second polysilicon gates; in Step 12, the second source-drain regions are self-aligned with the first sides of the second spacers, and the second lightly-doped drain region are stacked on the second source-drain regions.

14. The method for manufacturing the SONOS nonvolatile memory according to claim 12, wherein before the interlayer is formed in Step 13, the method further comprises the steps of forming metal silicides on surfaces of the first source-drain regions, the second source-drain regions and the second polysilicon gates through self-alignment.

15. The method for manufacturing the SONOS nonvolatile memory according to claim 14, wherein each said memotron further comprises a first polysilicon gate lead-out region, and after the metal silicides are formed and before the interlayer is formed in Step 13, the method further comprises of step of removing the first top silicon nitride layers at the top of the first polysilicon gates in the first polysilicon gate lead-out regions; and in Step 13 of forming the contact holes, a second contact hole is formed in the area, where the corresponding first top silicon nitride layer is removed, of the top of each said first polysilicon gate.

* * * * *